United States Patent [19]
Nishida

[11] 3,742,598
[45] July 3, 1973

[54] METHOD FOR FABRICATING A DISPLAY DEVICE AND THE DEVICE FABRICATED THEREBY

[75] Inventor: Sumio Nishida, Tokyo, Japan

[73] Assignee: Hitachi, Ltd., Tokyo, Japan

[22] Filed: Feb. 2, 1971

[21] Appl. No.: 111,847

[52] U.S. Cl. .............................. 29/574, 313/109.5
[51] Int. Cl. .............................. B01j 17/00
[58] Field of Search .................. 313/109.5; 340/336; 317/235 N, 235 V; 315/169 TV; 29/574

[56] References Cited

UNITED STATES PATENTS

| | | | |
|---|---|---|---|
| 3,490,873 | 1/1970 | Corl | 317/235 V UX |
| 3,618,202 | 11/1971 | Callahan et al. | 29/574 X |
| 3,354,342 | 11/1967 | Dantrup et al. | 317/235 N UX |
| 3,308,452 | 3/1967 | Michel et al. | 315/169 TV UX |
| 3,508,111 | 4/1970 | Davidson et al. | 313/109.5 UX |
| 3,418,509 | 12/1968 | Frouws et al. | 315/169 TV UX |
| 3,414,441 | 12/1968 | Gershenton et al. | 317/135 N UX |

OTHER PUBLICATIONS

Murray et al. "Lighting Up in a Group," Electronics, March 4, 1968, pp. 104–110

Barnett et al. "Seeing Red, Yellow and Green in a Semiconductor Alphanumeric Display," Electronics, May 11, 1970, pp. 88–93

*Primary Examiner*—Roy Lake
*Assistant Examiner*—James B. Mullins
*Attorney*—Craig, Antonelli, Stewart & Hill

[57] ABSTRACT

A method for fabricating a display device comprising the steps of forming a plurality of light-emitting diodes in a semiconductor wafer with a lattice pattern, and then dividing a unit of the seven light-emitting diodes which constitutes an 8-shaped pattern from the semiconductor wafer.

1 Claim, 8 Drawing Figures

INVENTOR

SUMIO NISHIDA

BY

Craig, Antonelli, Stewart & Hill

ATTORNEYS

METHOD FOR FABRICATING A DISPLAY DEVICE AND THE DEVICE FABRICATED THEREBY

This invention relates to semiconductor devices, especially to display devices of a plurality of semiconductor light-emitting elements.

It is a general object of this invention to provide a new and improved method for fabricating a display device of a plurality of light-emitting elements, and the device fabricated thereby.

Another object of the present invention is to provide a method according to which a display device is economically manufactured.

A feature of this invention is the use of a wafer in which a plurality of semiconductor light-emitting elements is formed in a semiconductor wafer so that a first unit of seven light-emitting elements constitutes a first 8-shaped pattern and a second unit of seven light-emitting elements having at least one light-emitting element of the first unit in common constitutes a second 8-shaped pattern.

The foregoing and other objects, features and advantages of the invention will become apparent from a consideration of the following description, taken in conjunction with the accompanying drawings, in which:

FIG. 1 (*b*) is a plan view of the display device unit divided from the wafer;

Figures 3A, 3B, 3C, 3D, 3E:
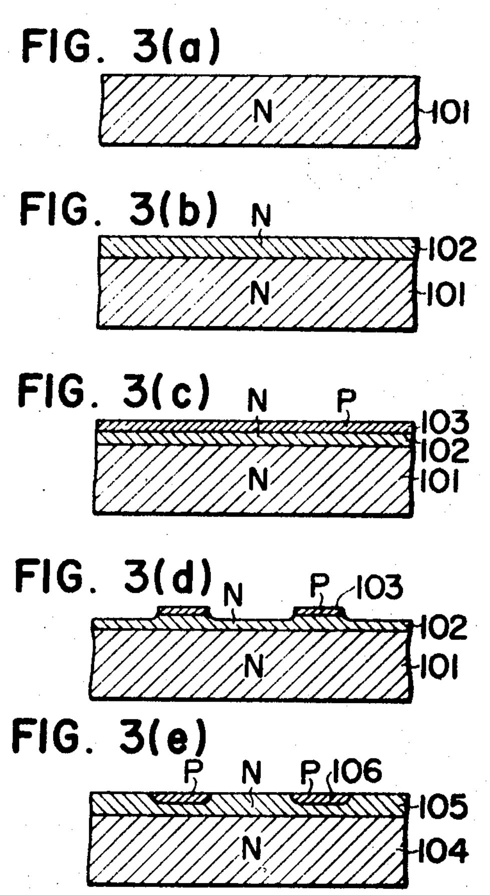

FIG. 3 (*a*) to 3 (*d*) are sectional views illustrating each manufacturing step of the wafer; and FIG. 3 (*e*) is a sectional view of the wafer according to another manufacturing method utilizable with the present invention.

Figure 1A:
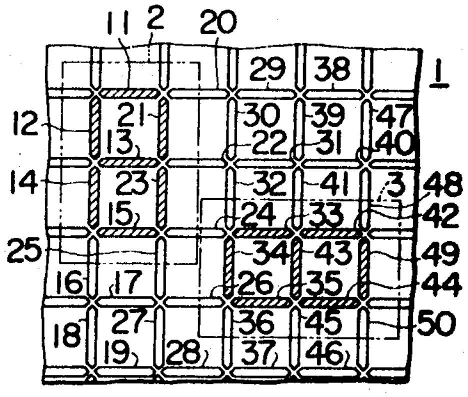
FIG. 1 (*a*) is a plan view of a wafer in which a plurality of light-emitting diodes is formed with a lattice pattern illustrating the manner of dividing a display device unit of seven light-emitting diodes from the wafer in accordance with the present invention.
Figure 1B:
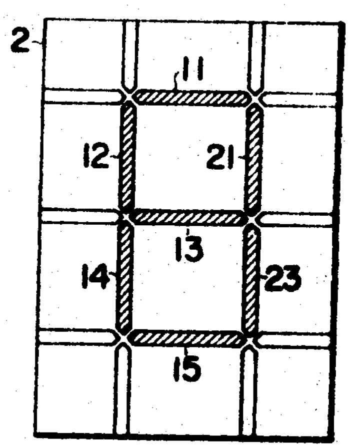

Referring to FIG. 1 (*a*), a plurality of light-emitting diodes are formed in a wafer 1 of a semiconductor, e.g., gallium arsenide phosphide with a lattice pattern or a crossed pattern. A set of the seven light-emitting diodes constitutes an 8-shaped pattern, that is, digits of 0 to 9 can be displayed by properly combining and energizing the diodes of the set.

In the wafer 1, a characteristic test is made at first of each of the diodes 11 to 50. As a result thereof, a set of seven good diodes which constitute an 8-shaped pattern is selected.

In FIG. 1 (*a*), in the case that the diodes 17, 24, 30, 40 and 45 are bad and the others are good, the set of diodes 11, 12, 13, 14, 15, 21 and 23 and the set of diodes 33, 34, 35, 42, 43, 44 and 49 are selected, as indicated by oblique shade lines representing the selected diodes. Then, the two sets are divided from the wafer along the dash and dotted lines 2 and 3, respectively.

FIG. 1 (*b*) shows the former set of a display device of FIG. 1 after being separated along the broken line 2. The set constitutes an 8-shaped pattern shown by the oblique shade lines and indicates the digits of 0 to 9, for example, it displays the digit 3 when a signal voltage is applied to the diodes 11, 13, 15, 21 and 23.

As the means for effecting the separation of the respective sets, several conventional methods, e.g., a scribing, etching or wire cutting method can be utilized. Either of these methods may be chosen according to the particular object. In case the sets of good diodes are irregularly distributed as shown in FIG. 1 (*a*), the etching method is most effective.

In accordance with the present invention, since a plurality of light-emitting elements are formed with a lattice pattern and the sets of only good elements are selected, a semiconductor material can be effectively used and in the case the material of light-emitting elements is of high cost such as of a chemical compound of gallium, e.g., gallium arsenide (GaAs), gallium arsenide phosphide (GaAsP), or gallium phosphide (GaP), it is extremely economical to apply the method according to the present invention.

To form the wafer 1 of FIG. 1 (a) in which the plurality of light-emitting diodes are employed, the steps illustrated in FIGS. 3 (*a*) to 3 (*d*) are carried out:

a. an N-type gallium arsenide (GaAs) substrate 101 about 300 microns in thickness is prepared;
b. an N-type gallium arsenide phosphide (GaAsP) layer 102 is grown on the substrate 101 to about 100 microns in thickness by epitaxial growth;
c. a P-type layer 103 is formed on the whole surface to about 5 microns in thickness by diffusing two elements of zinc-arsenic or three elements of gallium-zinc-phosphorous, etc.
d. then the plurality of light-emitting diodes electrically separated from one another are formed by etching the portions of the N-type layer 102 and P-type layer 103 into mesa shape, and thereafter electrodes for the substrate 101 and each separated P-type layer 103 are formed.

As shown in FIG. 3 (*e*), the light-emitting diode may also be formed of the planar type without being etched into mesa-shape by providing a P-type diffused region 106 utilizing conventional techniques.

Figure 2:
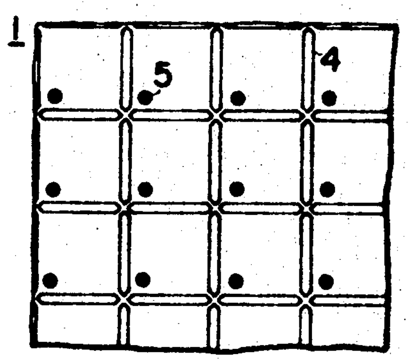
FIG. 2 is a plan view of a wafer wherein means for a decimal indicator is added to the wafer of FIG. 1 (*a*)

As an alternative, the embodiment of FIG. 2 may be employed. This embodiment employs a plurality of segments 5 in the left corners of all boxes, respectively, to readily indicate the decimal point. Connector wires are bonded to the segments 5, and an electric voltage is applied to the segment 5 to illuminate the same whereby a decimal point is indicated.

While I have shown and described only two embodiments in accordance with the present invention, it is understood that the same is not limited thereto but is susceptible of numerous changes and modifications as known to those skilled in the art, and I therefore do not wish to be limited to the details shown and described herein, but intend to cover all such changes as are encompassed by the scope of the appended claims.

What I claim is:

1. A method for manufacturing a semiconductor device wherein seven semiconductor elements, each element emitting a light when an electric voltage is applied thereto, are formed in an arrangement of substantially 8-shape in a semiconductor substrate, comprising the steps of forming a plurality of said semiconductor elements in a semiconductor wafer in such order that a first set of seven semiconductor elements constitutes a first 8-shaped pattern and at least one second set of seven semiconductor elements having at least one semiconductor element of said first set of seven semiconductor elements in common, constitutes a second 8-shaped pattern, testing each of said semiconductor elements to determine which are properly operable, and then dividing a set of seven semiconductor elements comprising properly operable elements which constitute an 8-shaped pattern from said semiconductor wafer.

* * * * *